(12) United States Patent
Tsai et al.

(10) Patent No.: US 9,356,127 B2
(45) Date of Patent: May 31, 2016

(54) LAYOUT STRUCTURE OF HETEROJUNCTION BIPOLAR TRANSISTORS

(71) Applicant: WIN Semiconductors Corp., Tao Yuan Shien (TW)

(72) Inventors: Shu-Hsiao Tsai, Tao Yuan Shien (TW); Hsiu-Chen Chang, Tao Yuan Shien (TW); Shinichiro Takatani, Tao Yuan Shien (TW); Cheng-Kuo Lin, Tao Yuan Shien (TW)

(73) Assignee: WIN SEMICONDUCTORS CORP., Tao Yuan Shien (TW)

( * ) Notice: Subject to any disclaimer, the term of this patent is extended or adjusted under 35 U.S.C. 154(b) by 67 days.

(21) Appl. No.: 13/913,290

(22) Filed: Jun. 7, 2013

(65) Prior Publication Data
US 2014/0312390 A1      Oct. 23, 2014

(30) Foreign Application Priority Data

Apr. 17, 2013     (TW) ............................. 102113675 A

(51) Int. Cl.
*H01L 29/737*     (2006.01)
*H01L 29/73*      (2006.01)
(Continued)

(52) U.S. Cl.
CPC .......... *H01L 29/737* (2013.01); *H01L 23/4824* (2013.01); *H01L 24/05* (2013.01); *H01L 24/06* (2013.01); *H01L 24/14* (2013.01); *H01L 29/7302* (2013.01); *H01L 29/7304* (2013.01); *H01L 29/7371* (2013.01); *H01L 24/13* (2013.01); *H01L 2224/0401* (2013.01); *H01L 2224/05572* (2013.01); *H01L 2224/06102* (2013.01); *H01L 2224/1134* (2013.01); *H01L 2224/131* (2013.01); *H01L 2224/13022* (2013.01); *H01L 2224/13082* (2013.01);
(Continued)

(58) Field of Classification Search
CPC ............... H01L 29/73; H01L 29/732–29/7378
See application file for complete search history.

(56) References Cited

U.S. PATENT DOCUMENTS

| | | | |
|---|---|---|---|
| 6,833,606 B2 * | 12/2004 | Nakamura et al. | 257/577 |
| 2005/0258452 A1 * | 11/2005 | Konishi et al. | 257/197 |
| 2006/0131608 A1 * | 6/2006 | Sugiyama | 257/197 |

(Continued)

OTHER PUBLICATIONS

Chang et al., "Use of WNx as the Diffusion Barrier for Interconnect Copper Metallization of InGaP—GaAs HBTs", IEEE Transactions on Electron Devices, vol. 51, No. 7, pp. 1053-1059, © 2004.*

*Primary Examiner* — Stephen W Smoot
*Assistant Examiner* — Sun M Kim
(74) *Attorney, Agent, or Firm* — Muncy, Geissler, Olds & Lowe, P.C.

(57) ABSTRACT

A layout structure of HBTs comprising one or more HBTs, each of which comprises a base electrode, an emitter electrode, and a collector electrode. A passive layer, a first dielectric layer, a collector redistribution layers, one or more emitter copper pillars, and one or more collector copper pillars are formed above the one or more HBTs. The passive layer comprises a collector and an emitter pads. The first dielectric layer has one or more emitter and collector via holes. The emitter copper pillar is disposed on the emitter via hole and forms an electrical connection to the emitter electrode. The collector copper pillar is disposed on the collector redistribution layer and forms electrical connection to the collector electrode. The layout design of the emitter and collector copper pillars is therefore flexible, and the heat dissipation efficiency is improved.

19 Claims, 13 Drawing Sheets

(51) Int. Cl.
*H01L 23/482* (2006.01)
*H01L 23/00* (2006.01)

(52) U.S. Cl.
CPC ............... *H01L2224/13147* (2013.01); *H01L 2224/1411* (2013.01); *H01L 2924/1305* (2013.01)

(56) References Cited

U.S. PATENT DOCUMENTS

2006/0138460 A1* 6/2006 Sasaki et al. ............... 257/197
2011/0215344 A1* 9/2011 Dardy et al. ................. 257/83
2011/0266595 A1* 11/2011 Hata ........................... 257/190

\* cited by examiner

LAYOUT STRUCTURE OF HETEROJUNCTION BIPOLAR TRANSISTORS

FIELD OF THE INVENTION

The present invention relates to a layout structure of heterojunction bipolar transistors (HBTs), and more particular to a layout structure of heterojunction bipolar transistors including redistribution layers (RDL) and copper pillars.

BACKGROUND OF THE INVENTION

With the development of mobile communication industry, the demand of high performance and small size electronic devices is also growing. The integrated circuits using compound semiconductor heterojunction bipolar transistors (HBTs) have been widely used in the mobile communication electronic devices for their high power, low noise, and small size. Therefore, by improving the performance and reducing the size of a compound semiconductor HBT circuit will increase the competitiveness of the product.

By applying the conventional flip-chip technology to the HBT device packaging, the emitter copper pillar can be disposed on the emitter electrode of the HBT to improve the heat dissipation efficiency of the device, and the collector copper pillar and/or the base copper pillar are disposed by employing the conventional metallization technology. However, there is a minimum distance between copper pillars in the conventional flip-chip technology, which limits the minimum die size and creates wasteful space between copper pillars, and therefore the competitiveness of the product is restricted. Besides, there is usually a great height difference between the emitter and the collector epitaxial layers, which leads to low uniformity of the height of the copper pillars formed on the emitter and collector electrodes of the HBT. The low uniformity of height of the copper pillars leads to bad contact of the device after packaging, which therefore restricts the packaging yield.

SUMMARY OF THE INVENTION

The main objective of the present invention is to provide a layout structure of HBTs comprising redistribution layers (RDL) and copper pillars. By combining the flip-chip and RDL technologies, the heat dissipation efficiency of the device can be improved, and the layout design of the emitter and collector copper pillars becomes more flexible. Moreover, the height difference between the emitter and collector copper pillars in the conventional flip-chip technology can be reduced by using a dielectric material of low dielectric coefficient material and good planarization efficiency, which improves the product yield.

Another objective of the present invention is to provide a layout structure of HBTs comprising redistribution layers and copper pillars. The die size can be reduced by taking the advantage of flexible layout design of the emitter and collector copper pillars and taking the most of the die space to arrange the passive devices of the circuit.

And one more objective of the present invention is to provide a layout structure of HBTs comprising redistribution layers and copper pillars, in which the height difference between the emitter and collector copper pillars can be compensated by filling the via holes, so that the product yield can be improved.

To reach the objectives stated above, the present invention provides a layout structure of HBTs, which comprises one or more HBTs, a passive layer, a first dielectric layer, a collector redistribution layer, one or more emitter copper pillars, and one or more collector copper pillars. The one or more HBTs are formed on a substrate. Each of HBTs comprises a base electrode, an emitter electrode, and a collector electrode. The passive layer is formed on the HBTs and comprises an emitter pad and a collector pad. The emitter pad is electrically connected to each of the one or more emitter electrodes, and the collector pad is electrically connected to each of the one or more collector electrodes. The first dielectric layer covers on the passive layer. The first dielectric layer comprises one or more emitter via holes formed on the emitter pad through the first dielectric layer and one or more collector via holes formed on the collector pad through the first dielectric layer. The collector redistribution layer is formed on the first dielectric layer and extends into the one or more collector via holes to form an electrical connection to the collector pad. Each of the one or more emitter copper pillars is disposed on at least one of the one or more emitter via holes and fills therein to form an electrical connection to the emitter pad. Each of the one or more collector copper pillars is disposed on the collector redistribution layer to form an electrical connection to the collector redistribution layer. Moreover, the layout structure of HBTs provided by the present invention can include an emitter redistribution layer on the first dielectric layer. The emitter redistribution layer extends into at least one of the one or more emitter via holes below one of the one or more emitter copper pillars and forms an electrical connection to the emitter pad.

To reach the objective of reducing the die size, the present invention provides several layout schemes to set up the copper pillars and the necessary passive devices:

Each of the one or more collector copper pillars is neighboring to the one or more emitter copper pillars. Each of the one or more collector copper pillars is formed on at least one of the one or more collector via holes and fills therein. One or more capacitors and resistors are included coupling to the HBTs, and the one or more capacitors and resistors are disposed in the passive layer in the region between the emitter pad and the collector pad.

Each of the one or more collector copper pillars is neighboring to the one or more emitter copper pillars. Each of the one or more collector copper pillars is formed on the collector pad excluding the region on the one or more collector via holes, and each of the more emitter copper pillars fills at least one of the one or more emitter via holes to reduce the difference in height between the one or more emitter copper pillars and the one or more collector copper pillars. One or more capacitors and resistors are included coupling to the HBTs, and the one or more capacitors and resistors are disposed in the passive layer in the region between the emitter pad and the collector pad.

The collector redistribution layer forms a collector redistribution layer extension region on the first dielectric layer, and each of the one or more collector copper pillars is disposed on the collector redistribution layer extension region excluding the region on the one or more collector via holes. Each of the more emitter copper pillars fills at least one of the one or more emitter via holes to reduce the difference in height between the one or more emitter copper pillars and the one or more collector copper pillars. One or more capacitors and resistors are included coupling to the HBTs. The one or more capacitors and resistors are disposed in the passive layer near the emitter pad excluding the region between the emitter pad and the collector pad, or the one or more capacitors and resistors are disposed in the passive layer under at least one of the one or more emitter copper pillars near the emitter pad excluding the region between the emitter pad and the collector pad.

The collector pad forms a collector pad extension region in the passive layer. At least one of the one or more collector via holes is formed on the collector pad extension region. Each of the one or more collector copper pillars is disposed on at least one of the one or more collector via holes on the collector pad extension region and fills therein. Each of the more emitter copper pillars fills at least one of the one or more emitter via holes to reduce the difference in height between the one or more emitter copper pillars and the one or more collector copper pillars. One or more capacitors and resistors are included coupling to the HBTs. The one or more capacitors and resistors are disposed in the passive layer near the emitter pad excluding the region between the emitter pad and the collector pad, or the one or more capacitors and resistors are disposed in the passive layer under at least one of the one or more emitter copper pillars near the emitter pad excluding the region between the emitter pad and the collector pad.

In implementation, the substrate is made of compound semiconductor material GaAs, GaN, SiC, or sapphire.

The present invention will be understood more fully by reference to the detailed description of the drawings and the preferred embodiments below.

DETAILED DESCRIPTIONS OF PREFERRED EMBODIMENTS

Figure 1A:
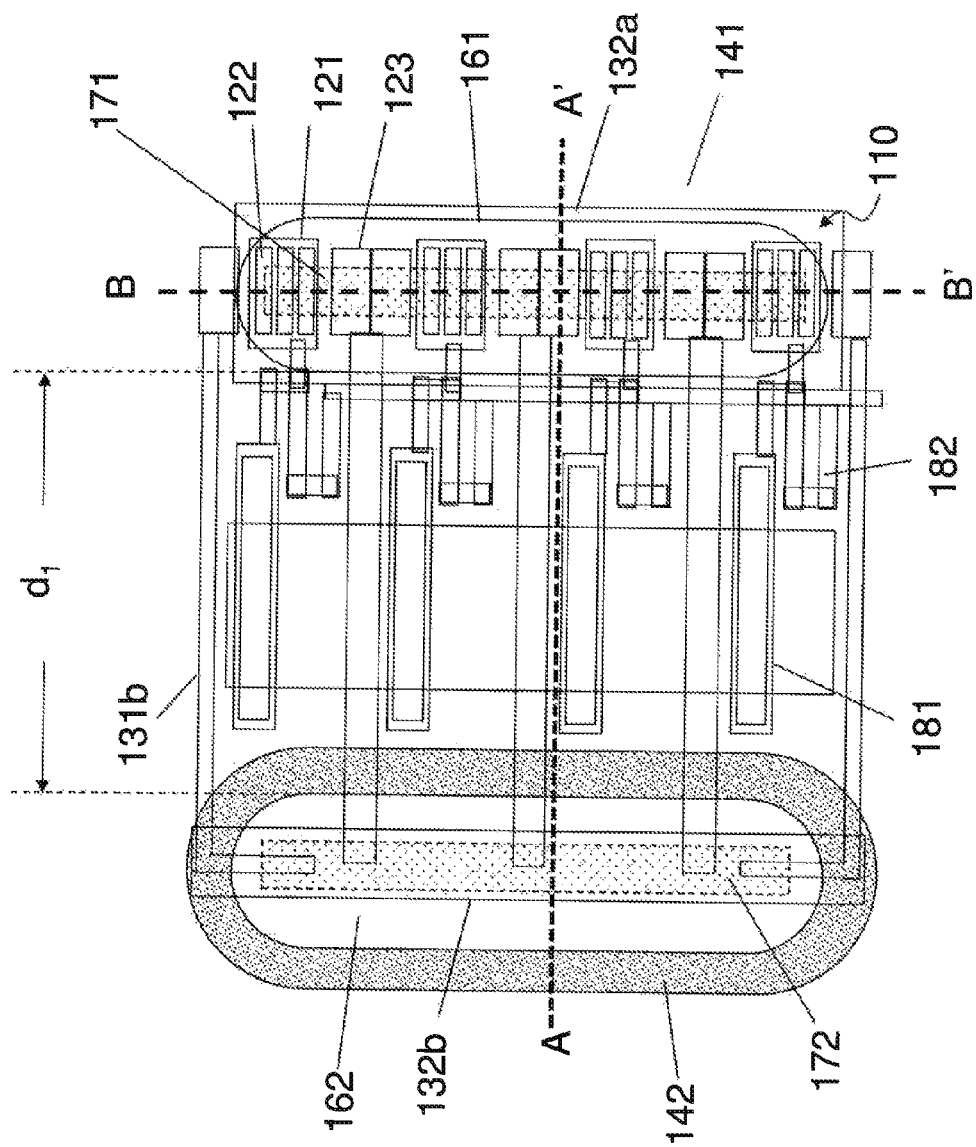
FIG. 1A is a schematic showing the plan view of an embodiment of a layout structure of HBTs provided by the present invention.
Figure 1B:
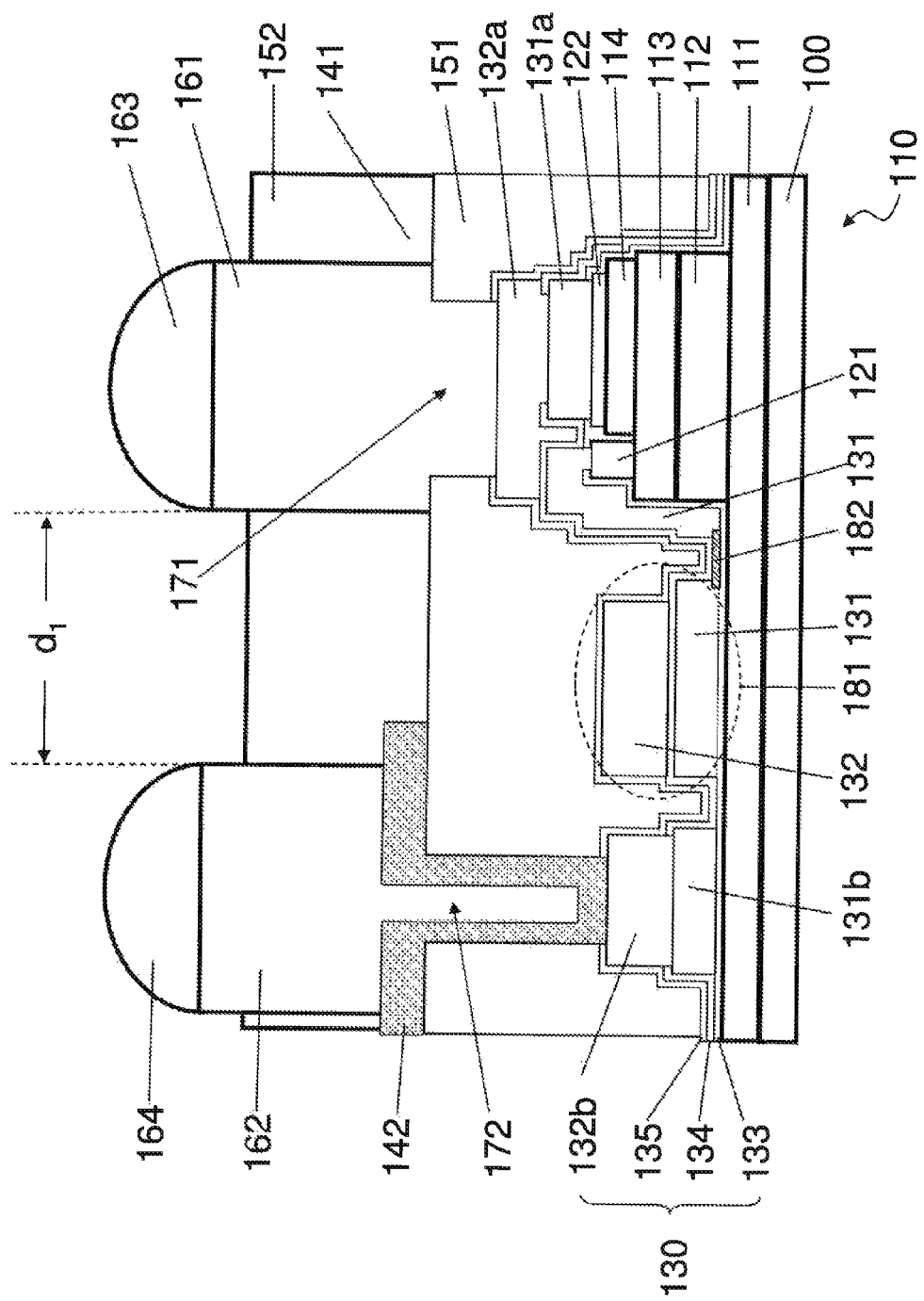
FIGS. 1B and 1C are schematics showing the cross-sectional view along line AA' and line BB' respectively in FIG. 1A.
Figure 1C:
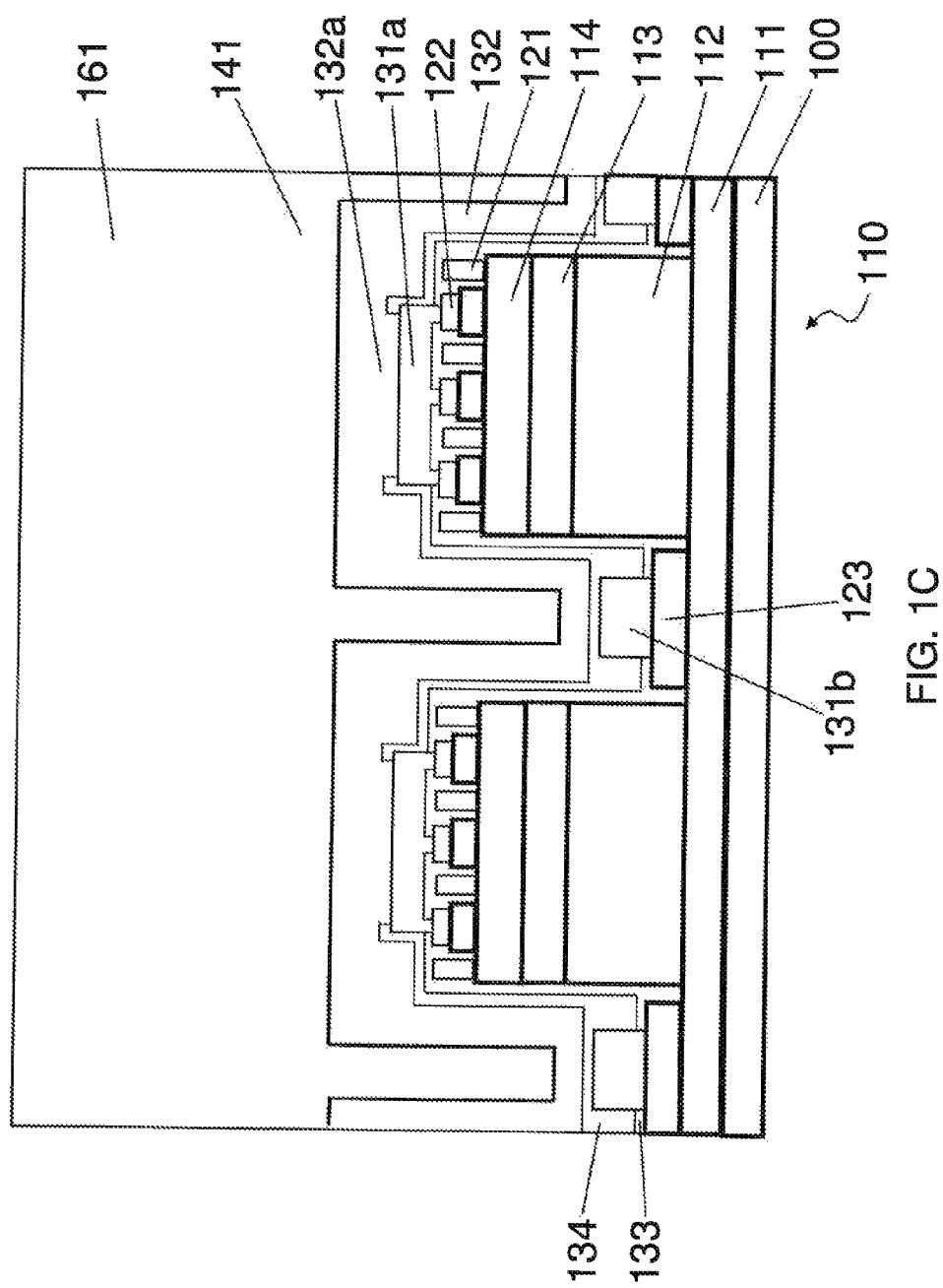
Figure 1D:
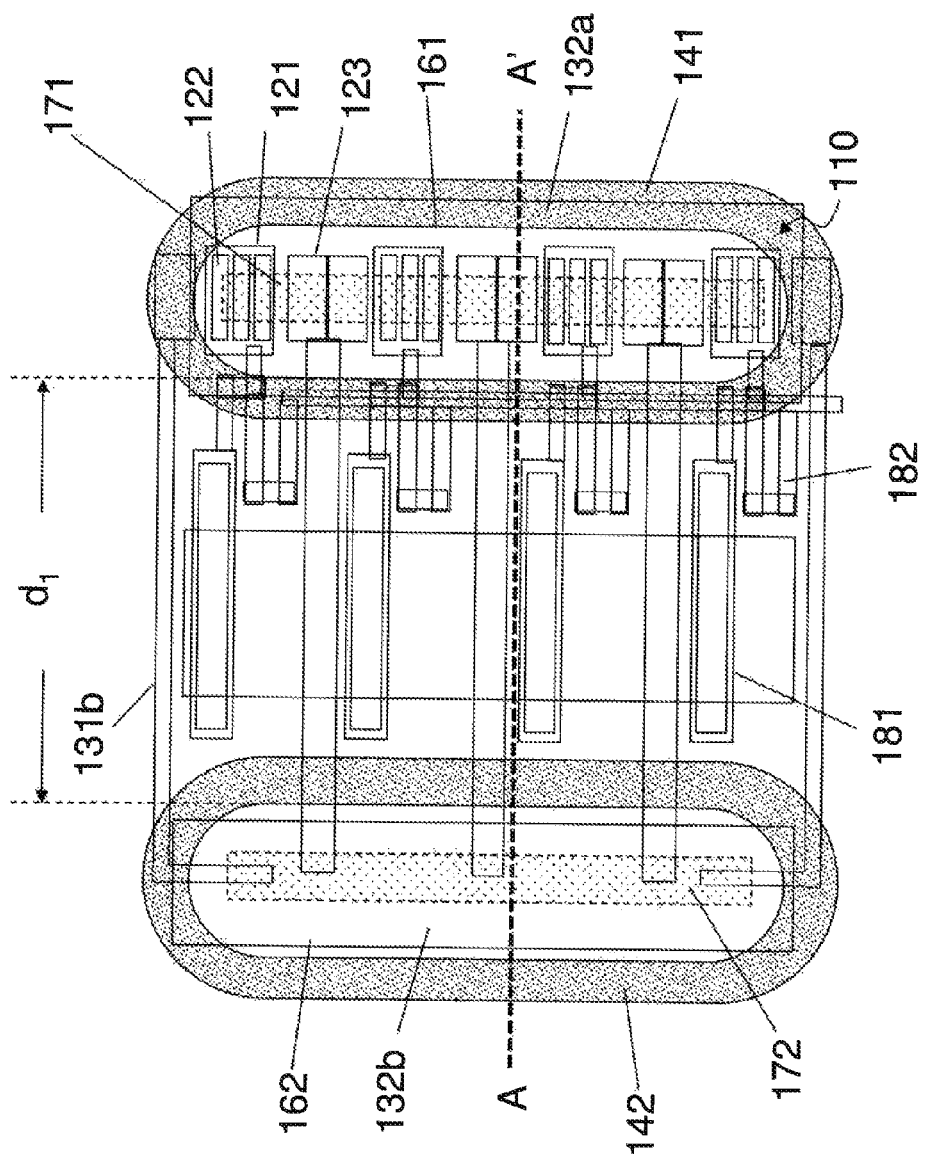
FIG. 1D is a schematic showing the plan view of another embodiment of a layout structure of HBTs provided by the present invention.
Figure 1E:
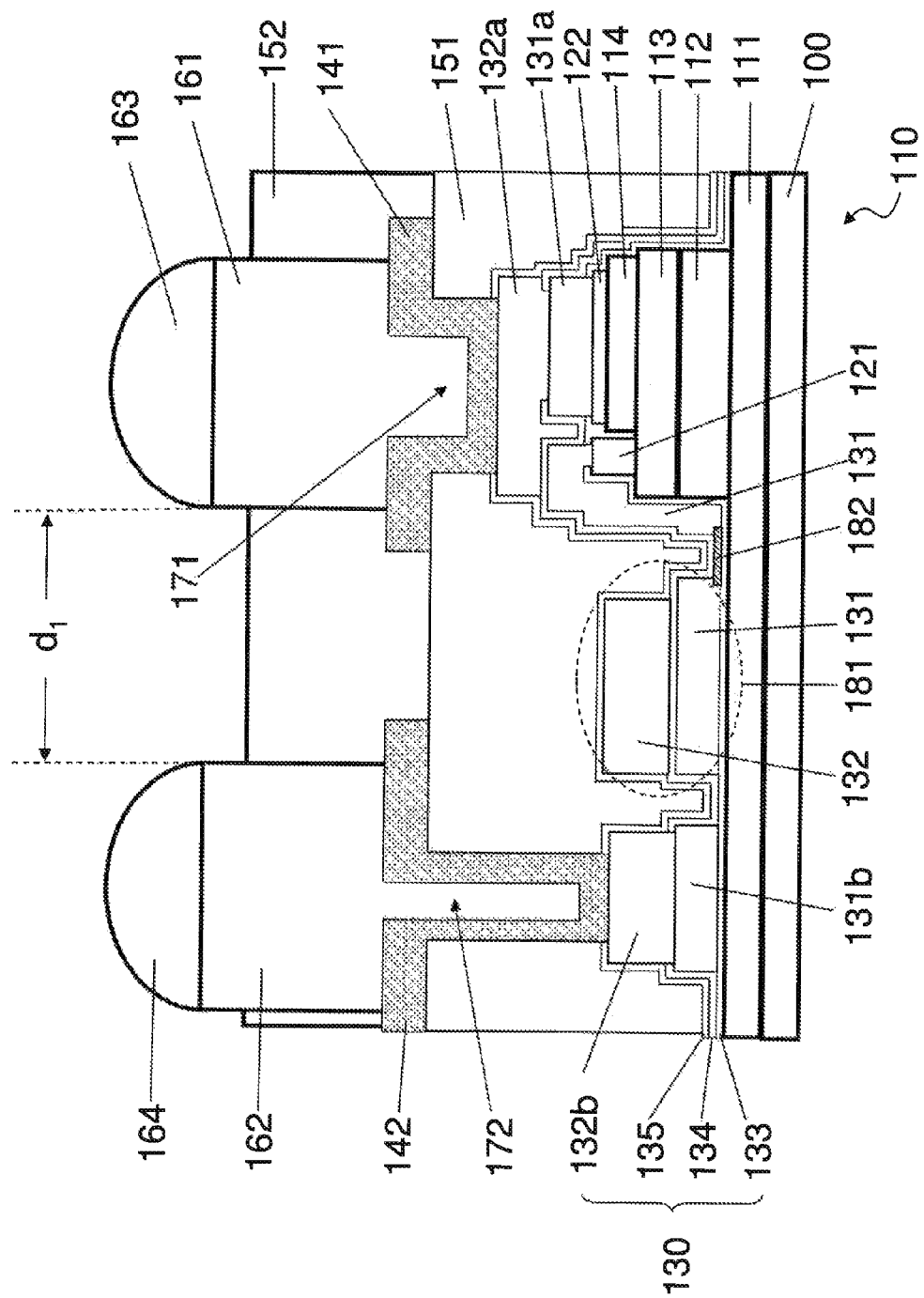
FIG. 1E is a schematic showing the cross-sectional view along line AA' in FIG. 1D.
Figure 1F:
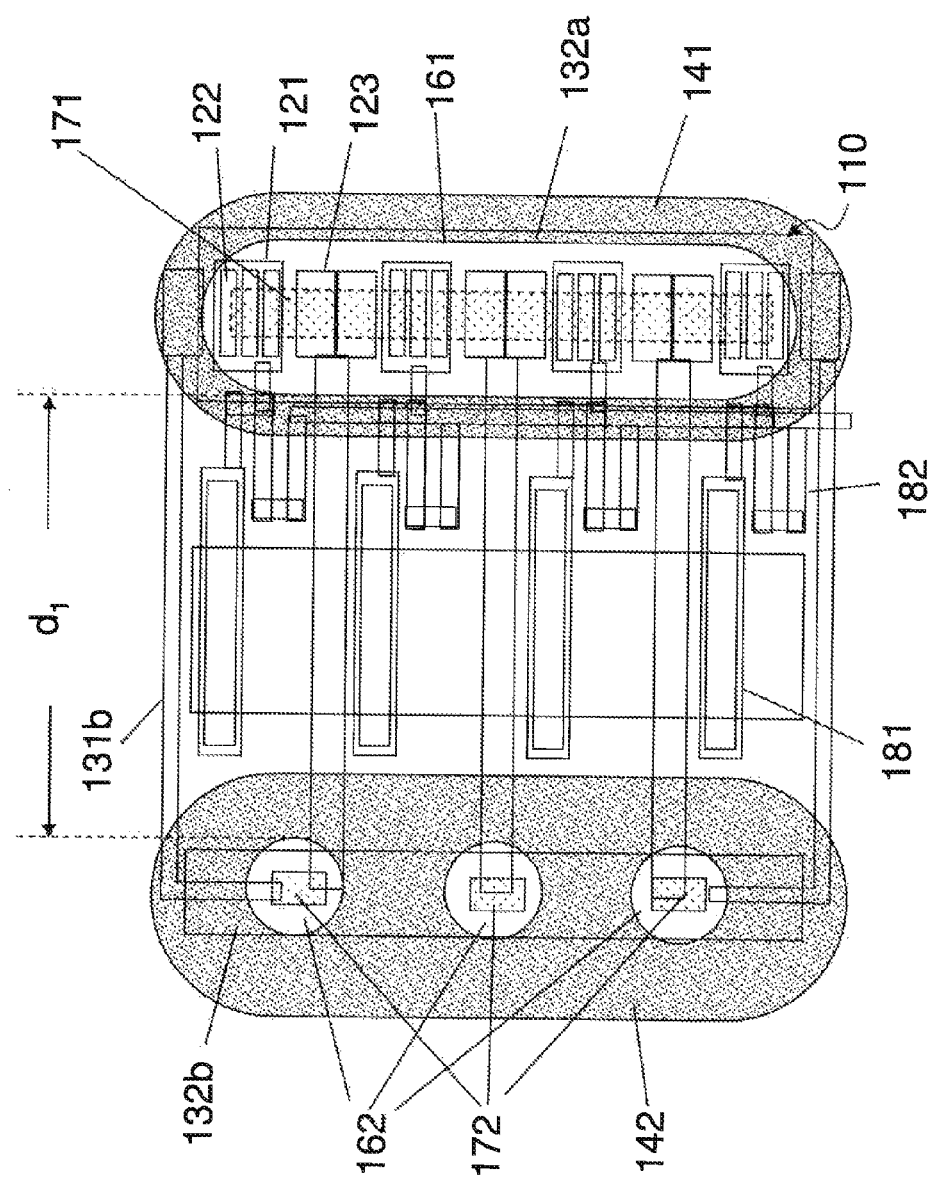
FIGS. 1F and 1G are schematics showing the plan view of another two embodiments of a layout structure of HBTs provided by the present invention.

FIG. 1A-1C are schematics showing an embodiment of a layout structure of HBTs provided by the present invention, in which FIGS. 1B and 1C are the cross-sectional views along line AA' and BB' respectively in FIG. 1A. As shown in the figures, the layout structure of HBTs comprises one or more HBTs 110, a passive layer 130, a first dielectric layer 151, a collector redistribution layer 142, an emitter copper pillar 161, and a collector copper pillar 162. The one or more HBTs 110 are formed on a substrate 100. Each of the one or more HBTs comprises a sub-collector layer 111, a collector layer 112, a base layer 113, and an emitter layer 114. In each of the HBTs, a base electrode 121 is provided on the base layer 113, an emitter electrode 122 is provided on the base layer 114, and a collector electrode 123 is provided on the collector layer 111. The passive layer 130 is formed on the HBTs 110 and comprises an emitter pad 131a and a collector pad 132b. The emitter pad 131a is electrically connected to each of the emitter electrodes 122. The collector pad 131b is electrically connected to each of the collector electrodes 123. The first dielectric layer 151 covers on the passive layer 130. The first dielectric layer 151 comprises an emitter via hole 171 formed on the emitter pad 131a through the first dielectric layer 151 and a collector via holes 172 formed on the collector pad 132b through the first dielectric layer 151. The collector redistribution layer 142 is formed on the first dielectric layer 151 and extends into the collector via holes 172 to form an electrical connection to the collector pad 132b. The emitter copper pillar 161 is formed on the emitter via hole 171 and fills therein to form an electrical connection to the emitter pad 132a. The collector copper pillar 162 is formed on the collector via hole 172 and fills therein to form an electrical connection to the collector redistribution layer 142. Solder balls 163 and 164 can be formed on the top of the emitter copper pillar 161 and the collector copper pillar 162 respectively. Moreover, the layout structure of HBTs provided by the present invention can include an emitter redistribution layer 141 on the first dielectric layer 151. As shown in FIGS. 1D and 1F, the emitter redistribution layer 141 extends into the emitter via hole 171 below the emitter copper pillar 161 and forms an electrical connection to the emitter pad 132a.

Figure 1G:
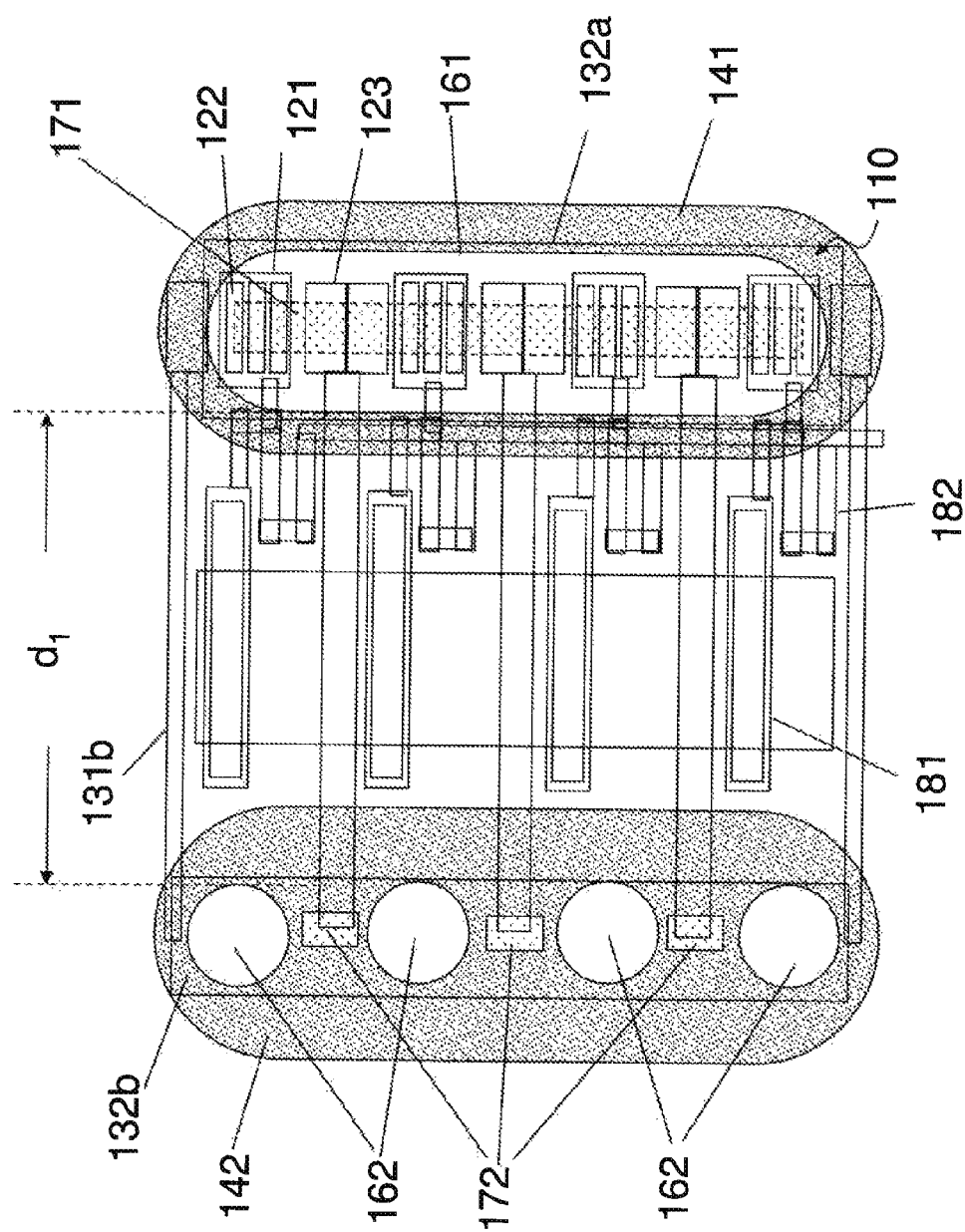

In the aforementioned embodiments, the emitter electrode of each of the one or more HBTs can be an electrode with parallel fingers. The emitter pad 131a and the collector pad 131b are elongated pad with their elongated axes parallel to each other. The emitter via hole 171, the collector via hole 172, and the emitter copper pillar 161 and the collector copper pillar 162 formed thereon respectively also have elongated shapes. The collector copper pillar 162 is neighboring to the emitter copper pillar 161 with their elongated axes parallel to each other. For the limit of the present flip-chip technology, the distance $d_1$ between the edges of the collector copper pillar 162 and the emitter copper pillar 161 usually ranges from 10 to 75 μm. The necessary passive devices can be disposed in the region between the emitter pad 131a and the collector pad 131b to reduce the die size. As shown in FIG. 1A to 1E, one or more capacitors 181 and resistors 182 are included coupling to the HBTs 110, and the one or more capacitors 181 and resistors 182 are disposed in the passive layer 130 in the region between the emitter pad 131a and the collector pad 132b. In the aforementioned embodiments, the elongated collector copper pillar can be replaced by one or more round collector copper pillars, and the elongated collector via hole can be replaced by one or more shorter collector via holes. Each of the one or more round collector copper pillars 162 can be disposed on at least one of the one or more collector via hole 172 and fills therein, as shown in FIG. 1F. Besides, each the one or more round collector copper pillars 162 can be disposed on the collector redistribution layer 142 excluding the region on the one or more collector via holes 172 to form an electrical connection to the collector pas 132b through the collector redistribution layer 142, as shown in FIG. 1G. To improve the heat dissipation efficiency, the emitter copper pillar usually has a larger surface area. An emitter copper pillar with a larger surface area usually grows taller than a collector copper pillar which has a smaller surface area in the manufacturing process, which leads to had contact of the chip after packaging. In the embodiments provided by the present invention, the difference in height between the emitter and the collector copper pillars can be compensated when the emitter copper pillar is formed on an emitter via hole and fills therein (FIG. 1G). When the emitter and collector copper pillars are both formed on via holes, the difference in height between the emitter and the collector copper pillars can be compensated by changing the size of the via holes (FIGS. 1D and 1F) or by removing the emitter redistribution layer (FIG. 1A).

Figure 2A:
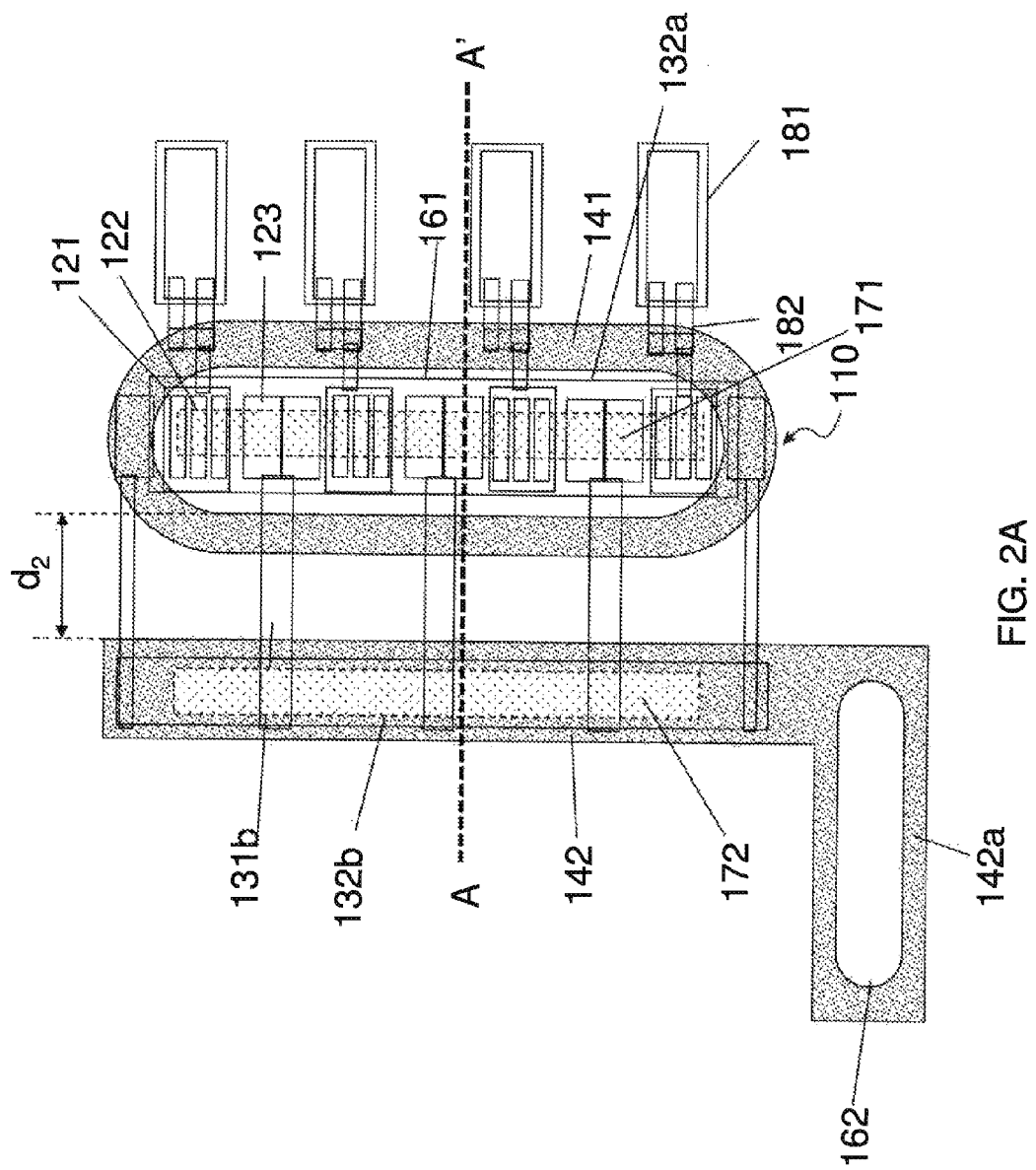
FIGS. 2A and 2B are schematics showing the plan view and of another embodiment of a layout structure of HBTs provided by the present invention and its cross-sectional view along line AA'.
Figure 2B:
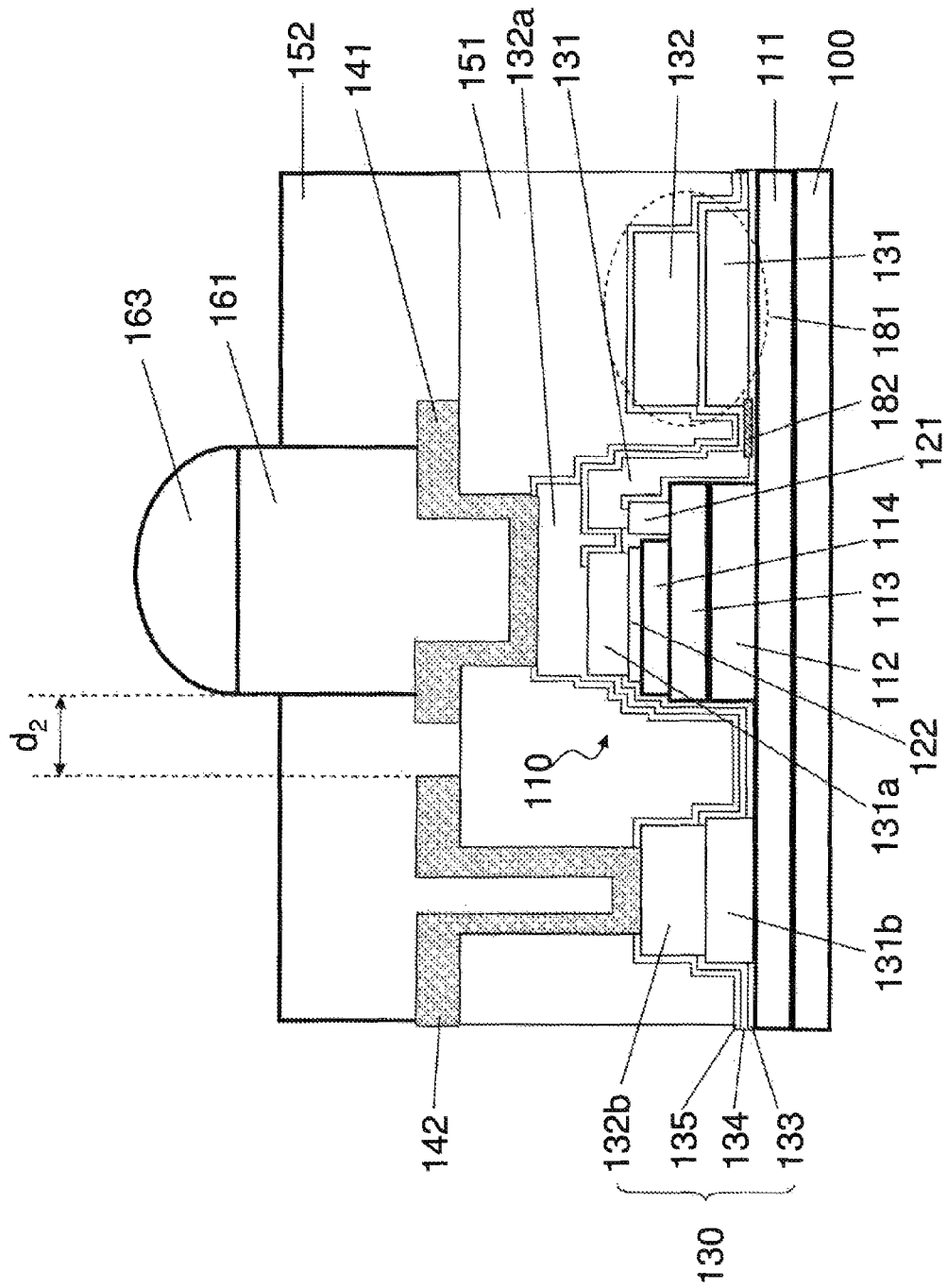

By extending the collector redistribution layers in the layout structure of HBTs, the collector copper pillar can then be move from a position parallel neighboring to the emitter copper pillar to an arbitrary position to take the most of the die space, so that the die size can be reduced. FIGS. 2A and 2B are schematics showing another embodiments provided by the present invention, in which the collector redistribution layer 142 can form a collector redistribution layer extension region 142a on the first dielectric layer 151. The collector copper pillar 162 is disposed on the collector redistribution layer extension region 142a excluding the region on the collector via hole 172. The collector pad 132b and the collector via hole 172 thereon can be moved closer to the emitter copper pillar 161 to reduce the die size. The edges of the emitter copper pillar 161 and collector redistribution layer 142 is defined as $d_2$. In implementation, there is no upper limit for $d_2$ but $d_2$ is preferably smaller. In the present embodiments, $d_2$ is ranging from 1 to 30 μm, preferably ranging from 1 to 20 μm, more preferably ranging from 1 to 10 μm, and most preferably ranging from 1 to 5 μm. Moreover, the size of the collector pad 131b can be decreased to further reduce the die size and save the material.

Figure 2C:
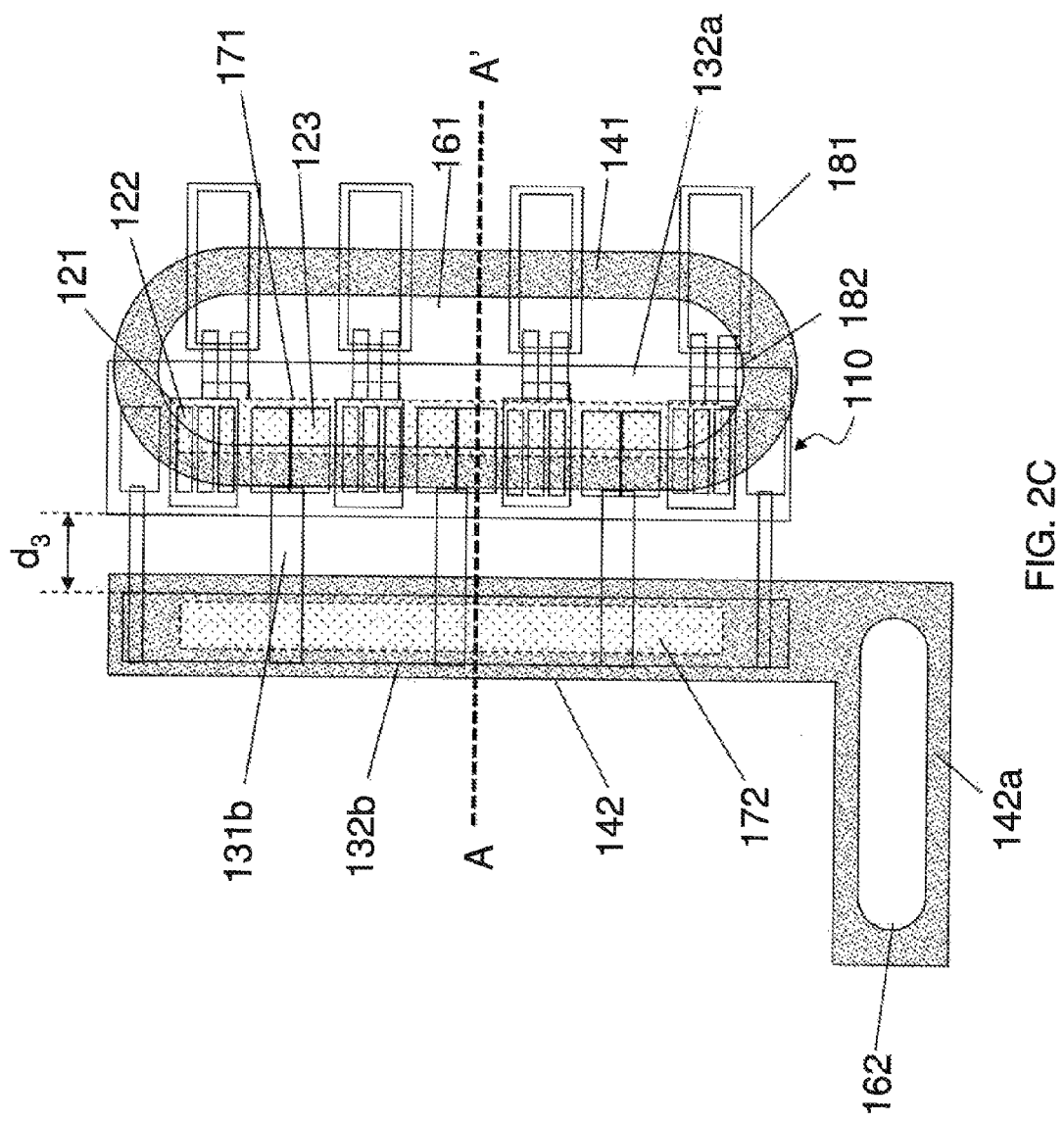
FIGS. 2C and 2D are schematics showing the plan view and of another embodiment of a layout structure of HBTs provided by the present invention and its cross-sectional view along line AA'.
Figure 2D:
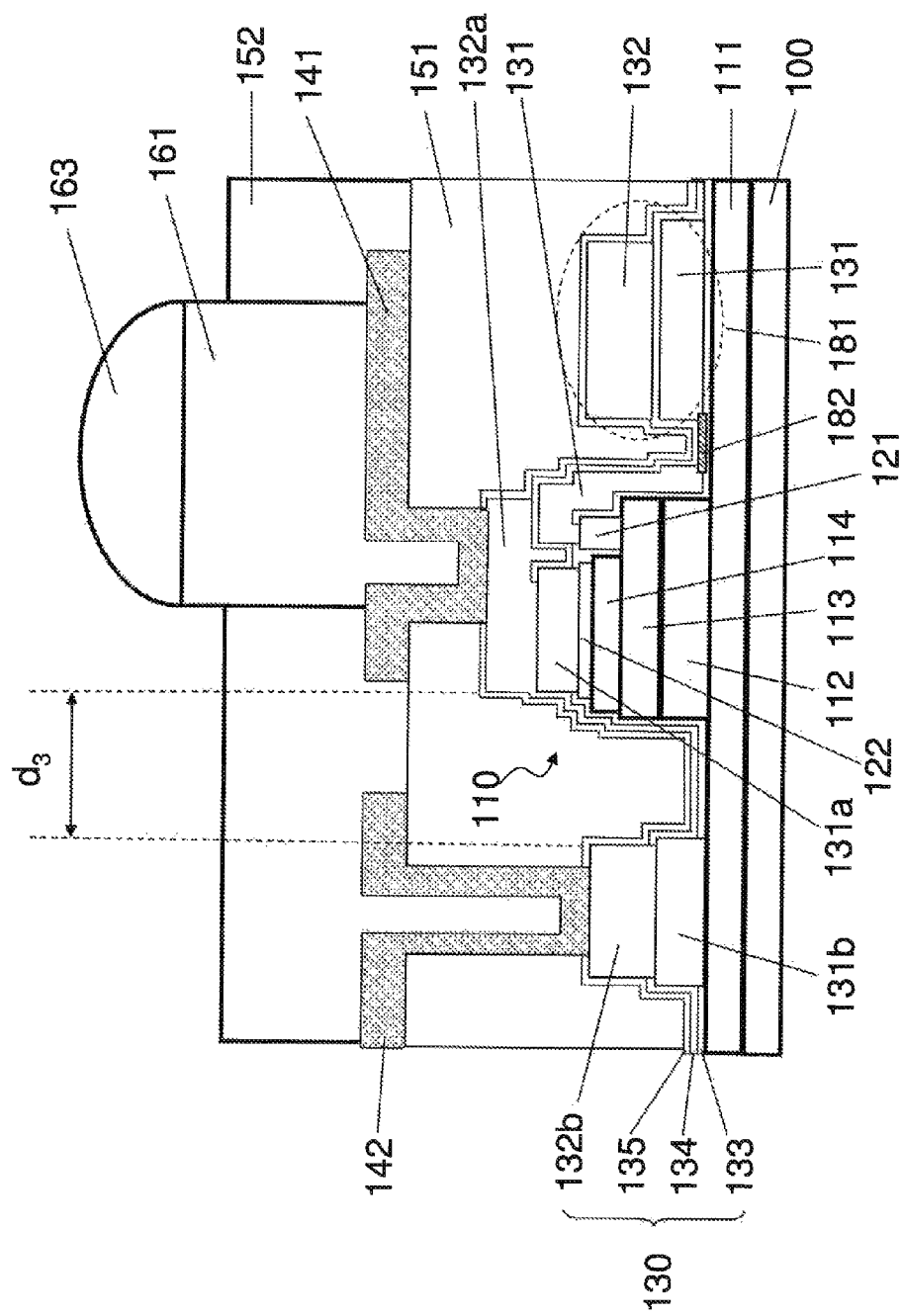

In the aforementioned embodiments, the necessary passive devices have to be removed from in the region between the emitter pad 131a and the collector pad 131b to the region outside the HBTs 110. As shown in FIGS. 2A and 2B, one or more capacitors 181 and resistors 182 are included in the passive layer 130 near the emitter pad 132a excluding the region between the emitter pad 131a and the collector pad 132b, and the one or more capacitors 181 and resistors 182 are coupling to the HBTs 110. By shifting the emitter pad 132a and the HBT epitaxial layers thereunder closer to the collector pad 132b, a space is formed under the emitter copper pillar 161. The necessary passive devices can then be disposed in this space, so that the die size can be further reduced. As shown in FIGS. 2C and 2D, one or more capacitors 181 and resistors 182 are included in the passive layer 130 under the emitter copper pillar 161 near the emitter pad 132a excluding the region between the emitter pad 131a and the collector pad 132b, and the one or more capacitors 181 and resistors 182 are coupling to the HBTs 110.

Figure 3A:
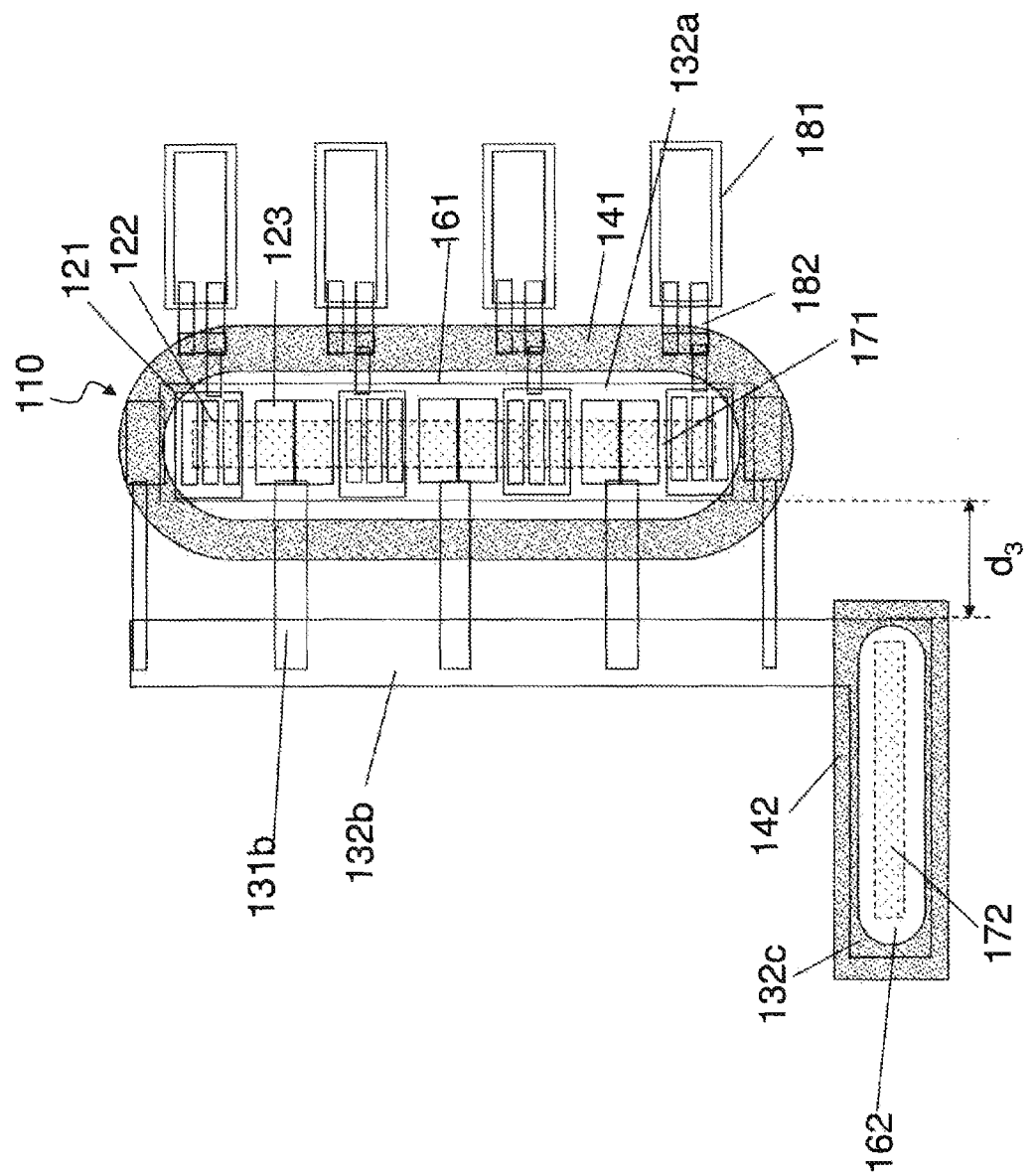
FIGS. 3A and 3B are schematics showing the plan view of another two embodiments of a layout structure of HBTs provided by the present invention.
Figure 3B:
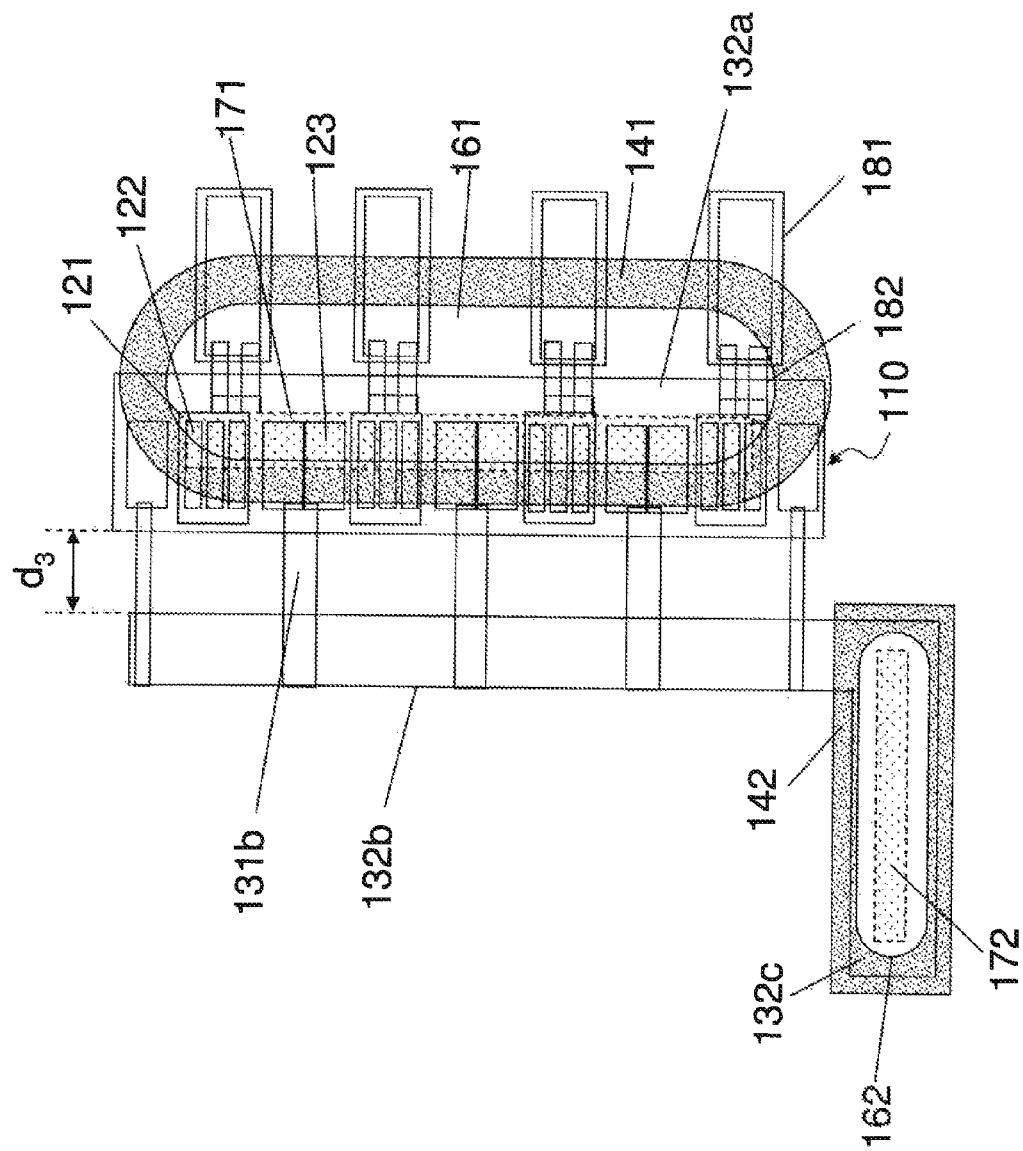

FIGS. 3A and 3B are schematics showing another embodiments provided by the present invention, in which the collector pad 131b forms a collector pad extension region 132c in the passive layer 130. The collector via hole 172 and the collector redistribution layer 142 are formed on the collector pad extension region 132c. The collector copper pillar 162 is disposed on the collector via hole 172 on the collector pad extension region 132c and fills therein. The collector pad 131b can thus be moved closer to the emitter pad 131a to reduce the die size. The edges of the emitter pad 131a and collector pad 131b is defined as $d_3$. In implementation, there is no upper limit for $d_3$ but $d_3$ is preferably smaller. In the present embodiments, $d_3$ is ranging from 1 to 20 μm, preferably ranging from 1 to 15 μm, more preferably ranging from 1 to 10 μm, and most preferably ranging from 1 to 5 μm.

In the aforementioned embodiments, the necessary passive devices have to be disposed on the region outside the HBTs 110. As shown in FIG. 3A, one or more capacitors 181 and resistors 182 are included in the passive layer 130 near the emitter pad 131a excluding the region between the emitter pad 131a and the collector pad 132b, and the one or more capacitors 181 and resistors 182 are coupling to the HBTs 110. By shifting the emitter pad 132a and the HBT epitaxial layers thereunder closer to the collector pad 132b, a space is formed under the emitter copper pillar 161. The necessary passive devices can then be disposed in this space, so that the die size can be further reduced. As shown in FIG. 3B, one or more capacitors 181 and resistors 182 are included in the passive layer 130 under the emitter copper pillar 161 near the emitter pad 132a excluding the region between the emitter pad 132a and the collector pad 132b, and the one or more capacitors 181 and resistors 182 are coupling to the HBTs 110.

The passive layer 130 in the present invention can include plural metal layers, which includes a first metal layer 131 formed on the bottom of the passive layer 130 and electrically connected to the base electrode 121, the emitter electrode 122, and the collector electrode 123, and a second metal layer 132 electrically connected to the redistribution layers. The first metal layer 131 can form metal pads (e,g. 131a and 131b) or metal lines. The first metal layer 131 is made essentially of Au and containing no Cu to prevent contamination of Cu atoms to the electronic devices. The second metal layer 132 forms the emitter pad 132a and the collector pad 132b. Because the second metal layer 132 has no direct contact to the electronic devices, it can be made of metal containing Au or Cu. One or more metal layers can be included between the first metal layer 131 and the second metal layer 132 for the interconnection. A covering layer covers on the HBTs and between each pair of neighboring metal layers excluding the electrical contact regions for insulation and passivation (e.g. 133-135). The covering layer is made of insulating materials, preferably of SiN. Besides forming electrical connections, the metal layers in the passive layer 130 can be used to form passive devices, such as capacitors. As shown in FIGS. 1B, 1E, 2B and 2D, the first metal layer 131, the second metal layer 132, and the covering layer 134 between them can form a metal-insulator-metal (MIM) capacitor, or they can form a stacked MIM capacitor by inserting one or more metal layers and covering layers in between.

In the embodiments provided by the present invention, the HBT 110 is a compound semiconductor device formed on a substrate 100. The substrate 100 is made of compound semiconductor material, preferably of GaAs, GaN, SiC, or sapphire, and most preferably of GaAs. The emitter redistribution layer 141 and the collector redistribution layer 142 can be made of metal of good conductivity, such as metal containing Au or Cu, preferably of metal containing Cu. The redistribution layer can form an inductor on the first dielectric layer to take the most of the free surface area of the chip. To reach the planarization requirement of the die surface in the packaging process, the first dielectric layer 151 is made preferably of spin-coating dielectric materials of good trench planarization efficiency. The dielectric material is coated on the uppermost covering layer by the spin-coating process, and cured by heating. The first dielectric layer 151 can be made of dielectric materials, such as polyimide, benzocyclobutene (BCB), or polybenzoxazole (PBO). The first dielectric layer 151 is made more preferably of PBO for its low dielectric constant and high tensile strength. Besides, the PBO dielectric material has a greater thickness after curing, which effectively compensates the difference in height between the emitter and collector epitaxial layers, and therefore the conduction copper pillars form on top of the device can have the same height.

Moreover, the layout structure of HBTs provided by the present invention can include a second dielectric layer 152 covering on the first dielectric layer 151, the emitter redistribution layer 141, and the collector redistribution layer 142 excluding the electrical contact region that connects the emitter copper pillar 161 and the collector copper pillar 162. The second dielectric layer 152 can be made of dielectric materials, such as polyimide, BCB, or PBO, preferably of PBO.

The die size of the chip made according to the layout design shown in FIG. 1A-1G is about 16% smaller than the chip produced by a previous technology. The die size of the chip made according to the layout design shown in FIG. 2A is about 34% smaller than the chip produced by a previous technology, and even 40% smaller than the chip produced by a previous technology according to the layout design shown in FIG. 2C.

The present invention has the following advantages:
1. In the layout structure of HBTs provided by the present invention, the emitter copper pillar is disposed on the emitter electrodes of HBTs, which therefore improves the heat dissipation efficiency of the device.
2. In the layout structure of HBTs provided by the present invention, the necessary passive devices such as capacitors and resistors can be disposed on the region between the emitter pad and the collector pad aligned in parallel if the there is enough space. The die size is thus reduced by taking the most of the die space.
3. In the layout structure of HBTs provided by the present invention, the collector copper pillar can be disposed on an arbitrary position through the redistribution layer to avoid the limit of the minimum distance between copper pillars in the conventional flip-chip technology, and therefore the die size can be reduced. Moreover, the size of the collector pad can be decreased, which further reduces the die size and save the material. Besides, the emitter pad and the HBT epitaxial layer can be shift closer to the collector pad to create a space under the emitter copper pillar. The necessary passive devices such as capacitors and resistors can then be disposed in the space under the emitter copper pillar, and therefore the die size can be further reduced.
4. In the layout structure of HBTs provided by the present invention, the dielectric layer is made of spin-coating dielectric materials of low dielectric constant, so that the difference in height between the emitter and collector epitaxial layers can be compensated, and conduction copper pillars form on top of the device can have the same height. Besides, the difference in height between the emitter and the collector copper pillars can be compensated when the emitter copper pillar with a larger surface area partially fills in the emitter via hole, thereby improving the product yield.

To sum up, the layout structure of HBTs provided by the present invention can indeed get its anticipated object to improve the heat dissipation efficiency of the chip and to reduce the die size. Besides, the uniformity of the height of the copper pillars can be improved, which leads to a higher product yield.

The description referred to the drawings stated above is only for the preferred embodiments of the present invention. Many equivalent local variations and modifications can still be made by those skilled at the field related with the present invention and do not depart from the spirit of the present invention, so they should be regarded to fall into the scope defined by the appended claims.

What is claimed is:

1. A layout structure of heterojunction bipolar transistors (HBTs), comprising:
    one or more HBTs formed on a substrate, each comprising a base electrode, an emitter electrode, and a collector electrode;
    a passive layer formed on the HBTs, comprising a first metal layer, an emitter pad and a collector pad, wherein the first metal layer is made essentially of Au and containing no Cu and formed on the bottom of the passive layer connecting to the base electrode, the emitter electrode, and the collector electrode, the emitter pad is electrically connected to each of the one or more emitter electrodes through the first metal layer, and the collector pad is electrically connected to each of the one or more collector electrodes through first metal layer;
    a first dielectric layer covering on the passive layer, comprising one or more emitter via holes formed on the emitter pad through the first dielectric layer and one or more collector via holes formed on the collector pad through the first dielectric layer;
    a collector redistribution layer formed on the first dielectric layer and extending into the one or more collector via holes to form an electrical connection to the collector pad;
    one or more emitter copper pillars, each disposed on at least one of the one or more emitter via holes and filling therein to form an electrical connection to the emitter pad;
    one or more collector copper pillars, each disposed on the collector redistribution layer to form an electrical connection to the collector redistribution layer; and
    an emitter redistribution layer formed on the first dielectric layer and extending into at least one of the one or more emitter via holes below one of the one or more emitter copper pillars and forms an electrical connection to the emitter pad.

2. The layout structure of HBTs according to claim 1, wherein the collector redistribution layer forms a collector redistribution layer extension region on the first dielectric layer, and each of the one or more collector copper pillars is disposed on the collector redistribution layer extension region excluding the region on the one or more collector via holes, and wherein each of the more emitter copper pillars fills at least one of the one or more emitter via holes to reduce the difference in height between the one or more emitter copper pillars and the one or more collector copper pillars.

3. The layout structure of HBTs according to claim 2, wherein one or more capacitors and resistors are included coupling to the HBTs, and the one or more capacitors and resistors are disposed in the passive layer near the emitter pad excluding the region between the emitter pad and the collector pad.

4. The layout structure of HBTs according to claim 2, wherein one or more capacitors and resistors are included coupling to the HBTs, and the one or more capacitors and resistors are disposed in the passive layer under at least one of the one or more emitter copper pillars near the emitter pad excluding the region between the emitter pad and the collector pad.

5. The layout structure of HBTs according to claim 1, wherein the collector pad forms a collector pad extension region in the passive layer, at least one of the one or more collector via holes is formed on the collector pad extension region, and each of the one or more collector copper pillars is disposed on at least one of the one or more collector via holes on the collector pad extension region and fills therein, and wherein each of the more emitter copper pillars fills at least one of the one or more emitter via holes to reduce the difference in height between the one or more emitter copper pillars and the one or more collector copper pillars.

6. The layout structure of HBTs according to claim 5, wherein one or more capacitors and resistors are included coupling to the HBTs, and the one or more capacitors and resistors are disposed in the passive layer near the emitter pad excluding the region between the emitter pad and the collector pad.

7. The layout structure of HBTs according to claim 5, wherein one or more capacitors and resistors are included coupling to the HBTs, and the one or more capacitors and resistors are disposed in the passive layer under at least one of the one or more emitter copper pillars near the emitter pad excluding the region between the emitter pad and the collector pad.

8. The layout structure of HBTs according to claim 1, wherein each of the one or more collector copper pillars is neighboring to the one or more emitter copper pillars, each of the one or more collector copper pillars is formed on at least one of the one or more collector via holes and fills therein, and wherein one or more capacitors and resistors are included coupling to the HBTs, and the one or more capacitors and resistors are disposed in the passive layer in the region between the emitter pad and the collector pad.

9. The layout structure of HBTs according to claim 1, wherein each of the one or more collector copper pillars is neighboring to the one or more emitter copper pillars, each of the one or more collector copper pillars is formed on the collector pad excluding the region on the one or more collector via holes, and each of the more emitter copper pillars fills at least one of the one or more emitter via holes to reduce the difference in height between the one or more emitter copper pillars and the one or more collector copper pillars, and wherein one or more capacitors and resistors are included coupling to the HBTs, and the one or more capacitors and resistors are disposed in the passive layer in the region between the emitter pad and the collector pad.

10. The layout structure of HBTs according to claim 1, wherein the substrate is made of compound semiconductor material GaAs, GaN, SiC, or sapphire.

11. The layout structure of HBTs according to claim 1, wherein the collector redistribution layer forms a collector redistribution layer extension region on the first dielectric layer, and each of the one or more collector copper pillars is disposed on the collector redistribution layer extension region excluding the region on the one or more collector via holes, and wherein each of the more emitter copper pillars fills at least one of the one or more emitter via holes to reduce the difference in height between the one or more emitter copper pillars and the one or more collector copper pillars.

12. The layout structure of HBTs according to claim 11, wherein one or more capacitors and resistors are included coupling to the HBTs, and the one or more capacitors and resistors are disposed in the passive layer near the emitter pad excluding the region between the emitter pad and the collector pad.

13. The layout structure of HBTs according to claim 11, wherein one or more capacitors and resistors are included coupling to the HBTs, and the one or more capacitors and resistors are disposed in the passive layer under at least one of the one or more emitter copper pillars near the emitter pad excluding the region between the emitter pad and the collector pad.

14. The layout structure of HBTs according to claim 1, wherein the collector pad forms a collector pad extension region in the passive layer, at least one of the one or more collector via holes is formed on the collector pad extension region, and each of the one or more collector copper pillars is disposed on at least one of the one or more collector via holes on the collector pad extension region and fills therein, and wherein each of the more emitter copper pillars fills at least one of the one or more emitter via holes to reduce the difference in height between the one or more emitter copper pillars and the one or more collector copper pillars.

15. The layout structure of HBTs according to claim 14, wherein one or more capacitors and resistors are included coupling to the HBTs, and the one or more capacitors and resistors are disposed in the passive layer near the emitter pad excluding the region between the emitter pad and the collector pad.

16. The layout structure of HBTs according to claim 14, wherein one or more capacitors and resistors are included coupling to the HBTs, and the one or more capacitors and resistors are disposed in the passive layer under at least one of the one or more emitter copper pillars near the emitter pad excluding the region between the emitter pad and the collector pad.

17. The layout structure of HBTs according to claim 1, wherein each of the one or more collector copper pillars is neighboring to the one or more emitter copper pillars, each of the one or more collector copper pillars is formed on at least one of the one or more collector via holes and fills therein, and wherein one or more capacitors and resistors are included coupling to the HBTs, and the one or more capacitors and resistors are disposed in the passive layer in the region between the emitter pad and the collector pad.

18. The layout structure of HBTs according to claim 1, wherein each of the one or more collector copper pillars is neighboring to the one or more emitter copper pillars, each of the one or more collector copper pillars is formed on the collector pad excluding the region on the one or more collector via holes, and each of the more emitter copper pillars fills at least one of the one or more emitter via holes to reduce the difference in height between the one or more emitter copper pillars and the one or more collector copper pillars, and wherein one or more capacitors and resistors are included coupling to the HBTs, and the one or more capacitors and resistors are disposed in the passive layer in the region between the emitter pad and the collector pad.

19. The layout structure of HBTs according to claim 1, wherein the substrate is made of compound semiconductor material GaAs, GaN, SiC, or sapphire.

* * * * *